United States Patent [19]
Ichimura et al.

[11] Patent Number: 5,961,773
[45] Date of Patent: Oct. 5, 1999

[54] PLASMA PROCESSING APPARATUS AND PLASMA PROCESSING METHOD USING THE SAME

[75] Inventors: Satoshi Ichimura, Hitachi; Tadashi Sato, Mito; Isao Hashimoto, Hitachi, all of Japan

[73] Assignee: Hitachi, Ltd., Tokyo, Japan

[21] Appl. No.: 08/823,835

[22] Filed: Mar. 25, 1997

[30] Foreign Application Priority Data

Mar. 28, 1996 [JP] Japan ................................. 8-073598

[51] Int. Cl.$^6$ ..................................................... H05H 1/00
[52] U.S. Cl. .................................. 156/345; 118/723 MP; 118/723 ME; 118/723 MR; 118/723 MA; 204/298.37; 204/298.38; 204/298.16
[58] Field of Search ...................... 156/345; 118/723 MP, 118/723 ME, 723 MR, 723 MA, 723 MW; 204/298.37, 298.38, 298.16; 315/111.41, 111.71

[56] References Cited

U.S. PATENT DOCUMENTS

| | | | |
|---|---|---|---|
| 4,776,918 | 10/1988 | Otsubo et al. | 156/345 |
| 5,370,765 | 12/1994 | Dandl | 156/345 X |
| 5,517,085 | 5/1996 | Engemann et al. | 118/723 MW |
| 5,620,522 | 4/1997 | Ichimura et al. | 118/723 MR |

OTHER PUBLICATIONS

Journal of Vacuum Science Technology, vol. B9, No. 1, Jan./Feb. 1991, "Characterization of a Permanent Magnet Electron Cyclotron Resonance Plasma Source", T. Mantei et al, pp. 26–33.

Primary Examiner—Thi Dang
Attorney, Agent, or Firm—Fay, Sharpe, Beall, Fagan, Minnich & McKee

[57] ABSTRACT

A plasma processing apparatus is provided with at least one waveguide portion for introducing microwaves, an electron heating space chamber formed on a downstream side with respect to a dielectric body in the waveguide portion, and a plasma generating space chamber coupled with the electron heating space chamber. A first static magnetic field generating device surrounds the electron heating space chamber using permanent magnets, producing a strong magnetic field exceeding an electron cyclotron resonance magnetic field strength along a propagation direction of the microwave in the electron heating space chamber and in a microwave leading-out portion of the dielectric body, and forming a cusped magnetic field. This cusped magnetic field falls steeply from a position of electron cyclotron resonance magnetic field strength to a boundary portion between the electron heating space chamber and the plasma generating space chamber and its direction is reversed to that of the strong magnetic field with decreasing distance from the boundary portion between the electron heating space chamber and the plasma generating space chamber to the plasma generating space chamber. A second static magnetic field generating device is provided with permanent magnets arranged around the plasma generating space chamber. Adjacent ones of the permanent magnets have polarities opposite to each other.

30 Claims, 9 Drawing Sheets

FIG. 4A
FIG. 4B
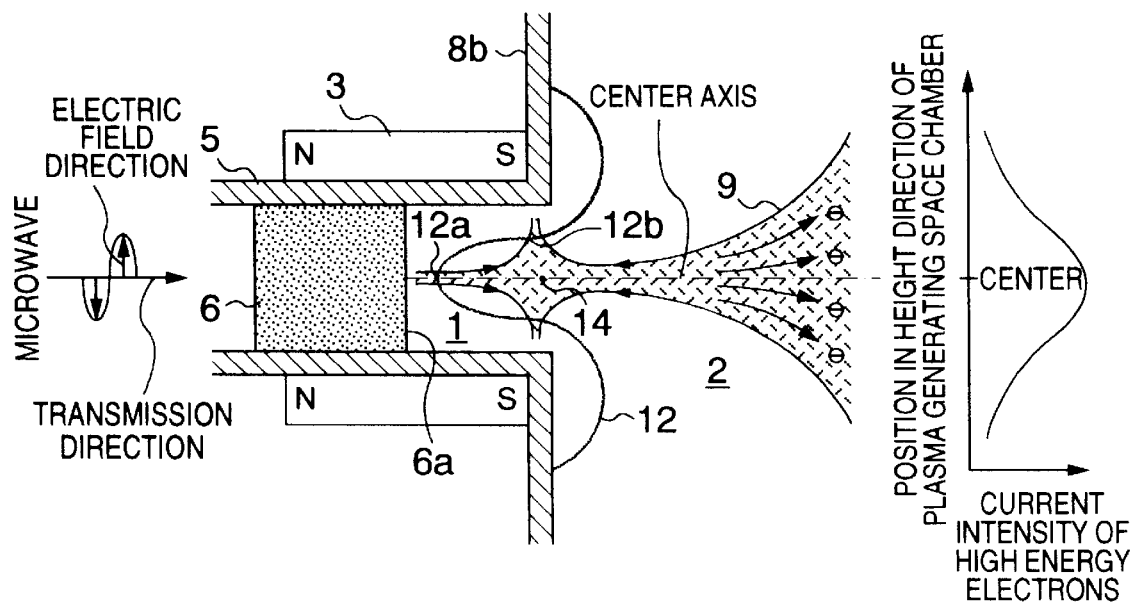
FIG. 4C
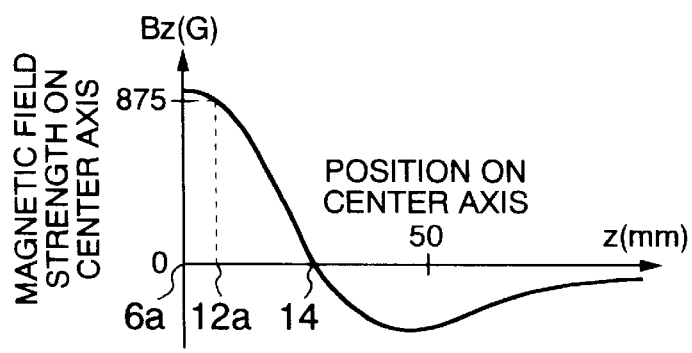

PLASMA PROCESSING APPARATUS AND PLASMA PROCESSING METHOD USING THE SAME

BACKGROUND OF THE INVENTION

The present invention relates to a plasma processing apparatus and to a plasma processing method using the same suitable for uniform plasma processing over a large area, which works specifically under a low gas pressure in a processing step using plasma such as plasma etching, ion doping, plasma CVD film formation, sputtering film formation, etc. for fabricating semiconductor devices, etc.

As prior art techniques for this kind of plasma processing apparatuses there are known those reported e.g. in J. Vac. Sci. Technol. B9(1), January/February 1991, p.26~p.28. In this paper it is described that a magnetic field similar to that formed by a solenoid coil used as means for generating a first static magnetic field described ibid. p.29~p.33 can be realized by means of permanent magnets. In this example permanent magnets for replacing the solenoid coil magnetic field should be huge.

SUMMARY OF THE INVENTION

An object of the present invention is to provide a microwave plasma processing apparatus capable of effecting plasma processing in a uniform high density plasma having a large extent by decreasing the size of the permanent magnets.

Another object of the present invention is to provide a microwave plasma processing apparatus capable of effecting plasma processing in a uniform plasma having a large extent, on which influences of the magnetic field are suppressed.

Still another object of the present invention is to provide a microwave plasma processing apparatus capable of generating a uniform high density plasma having a large extent for plasma processing.

The prior art techniques have problems described below, because the permanent magnets, which are the means for generating the first static magnetic field, are huge.

That is, at first, they have a problem that fabrication cost of the permanent magnets is correspondingly high. Attenuation rate of magnetic field at places distant from the permanent magnets is small and therefore strong magnetic field remains on a matter which is to be processed. For this reason, there is a problem that these techniques are unsuitable for processing matters sensitive to magnetic field, e.g. magnetic films, etc. Further, since in the magnetic field generated by huge permanent magnets attenuation in strength is small and thus spatial magnetic field gradient is small, spatial variations in propagation and absorption of microwaves are great, which gives rise to instability of discharge.

In general, from a point of view of quality of plasma, in order to make plasma uniform in a large extent, plasma generated in a strong magnetic field produced by the first static magnetic field generating means is diffused into a weak magnetic field region enclosed by a superficial magnetic field produced by a second static magnetic field generating means. Therefore a major part of generated ions traverse the magnetic field and kinetic energy of ions accelerated by gradient in plasma potential is transformed into thermal energy, which increases ion temperature. Further, separation of different kinds of ions takes place due to the difference in cyclotron radius in the magnetic field and in addition radicals generated at the same time as the plasma are also not made uniform by action of the electromagnetic field, which gives rise to still another problem that plasma processing is made non-uniform.

By the present invention a microwave plasma processing apparatus is provided, which can generate a uniform high density plasma having a large extent at a low cost by decreasing the size of the permanent magnets, in view of the problems of the prior art techniques, and which can subject matters to be processed to uniform plasma processing over a large area by using plasma thus generated, suppressing influences of magnetic field thereon.

The present invention is characterized in that it comprises at least one waveguide portion for introducing microwave; an electron heating space chamber portion formed on a downstream side with respect to a dielectric body in the waveguide portion; a plasma generating space chamber portion coupled to the electron heating space chamber portion; first static magnetic field generating means surrounding the electron heating space chamber portion by means of permanent magnets, which produce a strong magnetic field exceeding an electron cyclotron resonance magnetic field strength along a transmission direction of the microwave in the electron heating space chamber portion and in a microwave leading-out portion of the dielectric body, and which form a cusped magnetic field, which falls steeply from a position of electron cyclotron resonance magnetic field strength to a boundary portion between the electron heating space chamber portion and the plasma generating space chamber portion and a direction of which is reversed to that of the strong magnetic field with decreasing distance from the boundary portion between the electron heating space chamber portion and the plasma generating space chamber portion to the plasma generating space chamber portion; second static magnetic field generating means consisting of permanent magnets arranged around the plasma generating space chamber portion, every two of which have polarities opposite to each other; and means for holding a matter to be processed opposite to the plasma generating space chamber portion.

It is characterized further in that it comprises a counterplate disposed in front of the plasma generating space chamber portion, opposite to the matter to be processed; and means for applying a bias voltage to the counterplate.

According to the present invention, when the waveguide portion is fed with microwave, since the electron heating space chamber portion is formed on the downstream side with respect to the dielectric body in the waveguide portion and that space chamber portion is disposed within the waveguide portion having a small width in the direction of microwave electric field, it is possible to introduce microwaves having a strong electric field into the electron heating space chamber portion. Further, since microwaves are introduced into the electron heating space chamber portion from the strong magnetic field side having a strength exceeding an electron cyclotron resonance magnetic field strength, even if a plasma having a density higher than a cut-off density as plasma is produced, it is possible to have microwaves reach an electron cyclotron resonance layer with a high efficiency. Still further, since the width of the electron heating space chamber portion is so small as described above, the size of the permanent magnets acting as the first static magnetic field generating means arranged around it can be reduced.

In addition, since the permanent magnets acting as the first static magnetic field generating means form a magnetic field having a great gradient in the neighborhood of the electron cyclotron resonance magnetic field strength in the electron heating space chamber portion, even if a magnetic field strength at which microwaves are easily absorbed varies, depending on the state of plasma, it is possible to suppress spatial variations of microwave absorption positions to a value sufficiently small with respect to microwave wavelength. Consequently it is possible to eliminate instability factors concerning propagation and absorption of microwaves as far as possible and therefore to feed surely and stably the electron heating space chamber portion with microwaves having a high electric field. In this way, in the electron heating space chamber portion, it is possible to have electrons absorb almost all microwaves to heat them and to obtain high energy electrons.

At this time, since the permanent magnets acting as the first static magnetic field generating means form a cusped magnetic field, the magnetic field direction of which is reversed on the further downstream side from the boundary portion between the electron heating space chamber portion and the plasma generating space chamber portion as described above, electrons close to the axis of the electron heating space chamber portion are easily diffused towards the plasma generating space chamber portion. In addition, since the magnetic field produced by small permanent magnets is attenuated steeply with increasing distance, a large region within the plasma generating space chamber portion can be such a weak magnetic field region that high energy electrons in charge of ionization wander about, traversing the magnetic field. The weak magnetic field region in this meaning is a region where the magnetic field strength is usually lower than about 30 G.

The high energy electrons diffused in the plasma generating space chamber portion collide with neutral particles while wandering in the weak magnetic field region within the plasma generating space chamber portion so that they can generate a plasma uniform over a wide region by ionizing neutral particles. In addition, since a plurality of permanent magnets acting as the second static magnetic field generating means are arranged around the plasma generating space chamber portion so that every adjacent two of them have polarities opposite to each other to form a multi-pole cusped magnetic field, it is possible to confine not only diffused high energy electrons but also plasma produced by the high energy electrons with a high efficiency and therefore to form a high density plasma in the plasma generating space chamber portion. The plasma generated in the weak magnetic field region is hardly influenced by magnetic field and thus it has good properties that distribution of different kinds of ions is uniform and that ion temperature is low. Distribution of radicals produced in the weak magnetic field region together with the plasma is also uniform.

By holding a matter to be processed opposite to the plasma generated as described above, it is possible to effect plasma processing such as plasma etching, plasma CVD film formation, ion doping, etc. over a large area.

Further, when the plasma processing apparatus has a counterplate disposed in front of the plasma generating space chamber portion, opposite to the matter to be processed, and means for applying a bias voltage to the counterplate, it is possible to reduce remarkably contamination of the matter to be processed by particles by effecting plasma cleaning of the counterplate by applying a bias voltage to the counterplate after a plasma CVD film formation processing, etc. Further, when a target is held on the surface of the counterplate, which is brought into contact with the plasma, and sputter is effected while applying a bias voltage thereto, since the whole surface of the target is sputtered, a high utilization efficiency of the target can be obtained. In addition, if an operation is effected under a low gas pressure, sputtered particles fly well straight and therefore sputter film formation having a good step coverage with respect to the matter to be processed is made possible.

As described above, since a plasma processing apparatus is so constructed that an electron heating space chamber portion is disposed so that microwaves having a strong electric field can be introduced stably into a waveguide, that permanent magnets acting as first static magnetic field generating means arranged on the outer periphery of the electron heating space chamber portion generate a strong magnetic field exceeding an electron cyclotron resonance magnetic field strength in a microwave leading-out portion of a dielectric body, that at the same time the magnetic field falls steeply from an electron cyclotron resonance magnetic field strength to a boundary portion between the electron heating space chamber portion and a plasma generating space chamber portion, and that a cusped magnetic field, whose direction is reversed to that of the strong magnetic field with decreasing distance from the boundary portion between the electron heating space chamber portion and the plasma generating space chamber portion to the plasma generating space chamber portion, is formed, the size of the permanent magnets can be reduced and they become cheaper correspondingly. In addition, since a plurality of permanent magnets acting as second static magnetic field generating means are arranged around the plasma generating space chamber portion, every adjacent two of which have polarities opposite to each other, a high density plasma, which is uniform over a wide region, can be surely formed in the whole plasma generating space chamber portion. Further, owing to the fact that there is almost no magnetic field on a matter to be processed and that it can be surely utilized for the purpose of work of magnetic films, etc., it has an effect that processed matters of good quality having a large area can be stably obtained.

Further, owing to the fact that there are disposed a counterplate in front of the plasma generating space chamber portion, opposite to the matter to be processed, and means for applying a bias voltage to the counterplate, it is possible to effect plasma cleaning of the counterplate while applying a bias voltage to the counterplate after plasma CVD film formation, etc. and therefore to reduce contamination of the matter to be processed by particles. Further, when a target is held on the surface of the counterplate, which is brought into contact with the plasma, and sputter is effected while applying a bias voltage thereto, since the whole surface of the target is sputtered, a high utilization efficiency of the target can be obtained. In addition, if an operation is effected under a low gas pressure, sputtered particles fly well straight and therefore sputtering film formation having a good step coverage with respect to the matter to be processed is made possible.

BRIEF DESCRIPTION OF THE DRAWINGS

FIG. 4A is an enlarged diagram showing a principal part of the present invention;

FIG. 4B is a diagram showing a relation between high energy electron current density and a plasma generating space chamber portion;

FIG. 4C is a graph showing a magnetic field strength distribution at different positions in an electron space chamber portion and the plasma generating space chamber portion;

DESCRIPTION OF THE PREFERRED EMBODIMENTS

Figure 1:
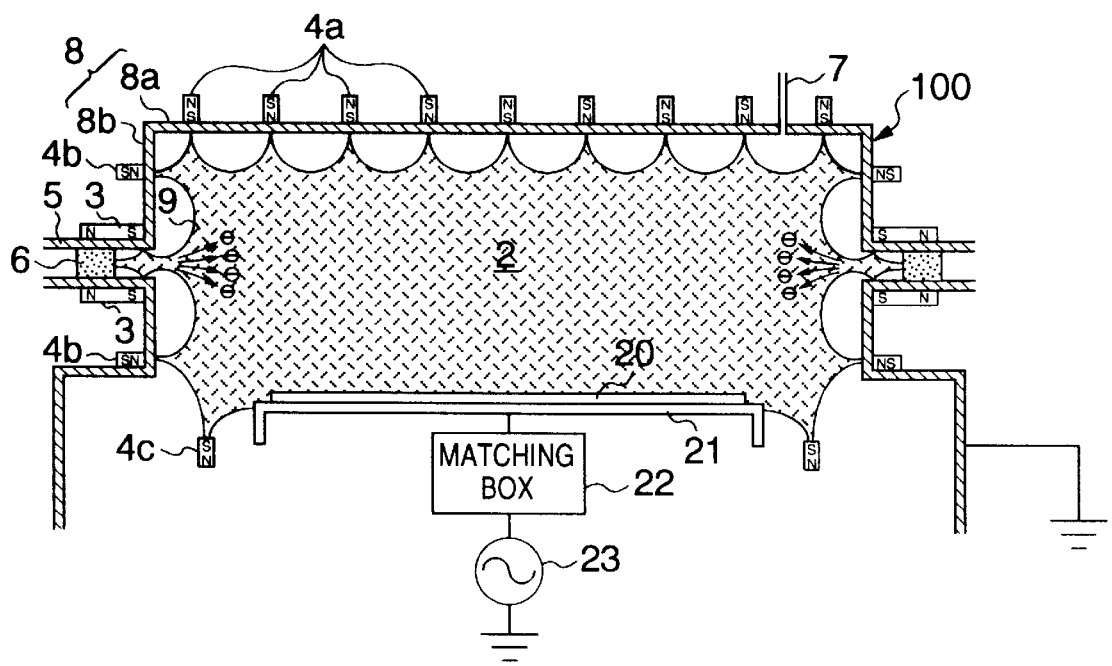
FIG. 1 is a cross-sectional view for explaining a first embodiment of the plasma processing apparatus according to the present invention.
Figure 2:
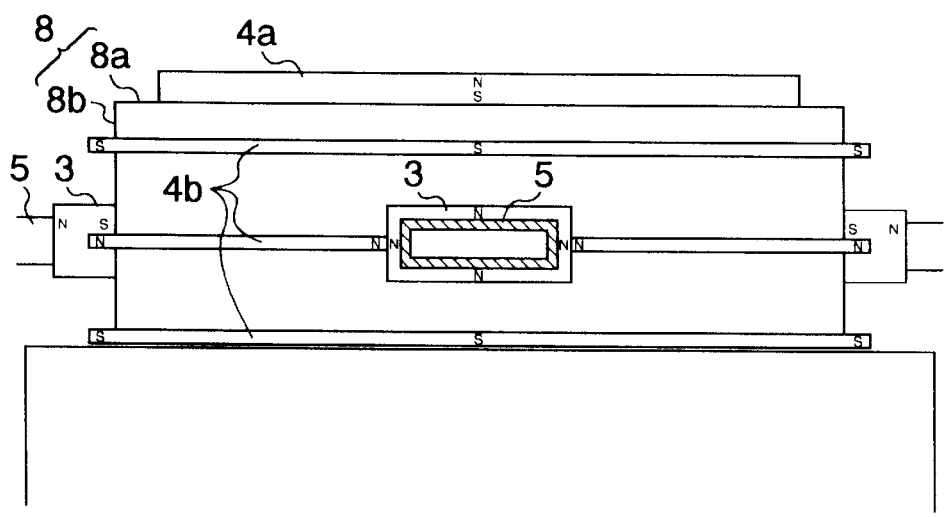
FIG. 2 is a front view of the plasma processing apparatus shown in FIG. 1.
Figure 3:
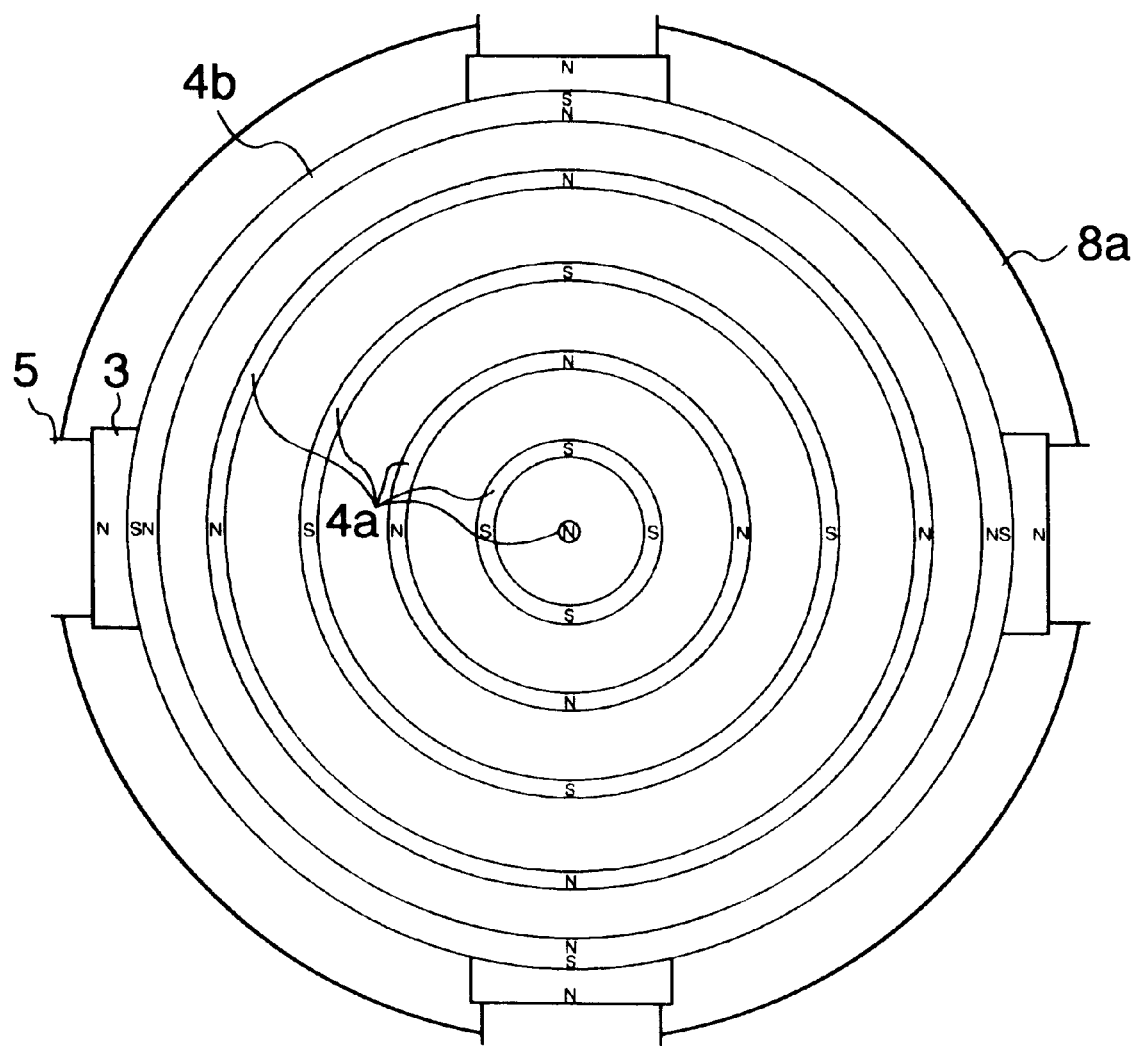
FIG. 3 is a plan view of the plasma processing apparatus shown in FIG. 1.

Several embodiments of the present invention will now be explained, referring to FIGS. 1 to 11, in which FIGS. 1 to 4A–4C correspond to a first embodiment of the present invention.

In the present embodiment a discharge chamber 100 is formed, which chamber includes four electron heating space chamber portions 1, each of which is formed in each of four waveguide portions 5, and a plasma generating space chamber portion 2, to a peripheral wall of which the four waveguide portions 5 are coupled.

A specified gas is introduced into the discharge chamber 100 through gas introducing means 7 while evacuating the discharge chamber by means of an evacuating system not indicated in the figures to put the interior of the discharge chamber 100 in an atmosphere of that gas and microwaves are is introduced through the waveguide portions 5 into the discharge chamber 100 to generate plasma by giving rise to microwave discharge therein. In this way it is possible to effect plasma processing such as plasma etching, plasma CVD film formation, ion doping, etc. by the plasma thus generated and radicals produced, accompanying it, on a substrate 20 supported on a supporting table 21, to which an AC bias voltage is applied by a high frequency power supply 23 and a matching box 22. The gas pressure at this plasma processing is a low gas pressure of about $10^{-5}$ to $10^{-3}$ Torr. Each of the waveguide portions 5 in the present embodiment consists in a rectangular waveguide (transversal width is 27 mm and depth is 96 mm) having a small transversal width made of a non-magnetic material such as stainless steel and aluminium, in which a dielectric body 6 is mounted at an intermediate position in order to hold air-tightness of the discharge chamber 100. It is so constructed that, when microwaves having a frequency of 2.45 GHz used usually is introduced from the upstream side not indicated in the figures, only microwaves of the fundamental mode (mode $TE_{10}$) are transferred to the downstream side. The dielectric body 6 is made usually of ceramics such as quartz, alumina, etc.

In the present embodiment, the electron heating space chamber portion 1 has a small cross-sectional shape formed at a position on the downstream side in the microwave transmission direction from the dielectric body 6 in the waveguide portion 5, as indicated in FIGS. 1 and 4A, and it is so constructed that, when microwaves are introduced into the waveguide portion 5, the microwave introduced into the electron heating space chamber portion 1 produce a strong electric field, owing to the fact that the electron heating space chamber portion 1 has a small cross-sectional shape formed in the waveguide portion 5. The waveguide portion 5 formed by the rectangular waveguide, as described previously, has a length of about 30 mm in the axial direction.

The plasma generating space chamber portion 2 has a circular upper wall 8a and a peripheral wall 8b therefor made of a non-magnetic material such as stainless steel, aluminium, etc. and it is formed so as to be hollow so that it has a space (inner diameter is 500 mm and distance between the upper wall 8a and the substrate 20 is 170 mm) much greater than the electron heating space chamber portion 1. Permanent magnets 3 acting as first static magnetic field generating means are arranged on the outer periphery of the electron heating space chamber portion 1. The permanent magnets 3 are made of samarium, cobalt, etc. having a great residual flux density (about 11000 G) and arranged so as to surround the outer periphery of the waveguide portion 5, disposed on the outer periphery of the waveguide portion 5 along the axial length direction from the dielectric body 6 side to the downstream end, as indicated in the figures, so that a magnetic field is formed along the transmission direction of the microwave, as indicated in FIGS. 1 and 4A–4C. At this time, the magnetic field has a strength (about 950 G in the present embodiment) exceeding an electron cyclotron resonance magnetic field strength (875 G) in a microwave leading-out portion 6a of the dielectric body 6, as indicated in FIGS. 4A and 4C. It is so constructed that, in addition, it is steeply attenuated therefrom towards the downstream side so that it is 0 at a position 14, where the magnetic field strength is 0 in the neighborhood of the boundary between the ending side of the electron heating space chamber portion 1 and the plasma generating space chamber portion 2 and further that a cusped magnetic field can be formed, the magnetic field direction of which is reversed on the downstream side therefrom to the plasma generating space chamber position 2.

Further it is preferable that the distance from an electron cyclotron resonance layer 12 to the position 14, where the magnetic field strength falls to 0 in the neighborhood of the boundary between the electron heating space chamber portion 1 and the plasma generating space chamber portion 2, is smaller than the wavelength of the microwave supplied to the waveguide portion 5. Each of the permanent magnets 3 forming such a magnetic field is 6 mm thick and 50 mm long in the magnetization direction and the length of the periphery thereof is 300 mm in the present embodiment.

A plurality of permanent magnets 4 acting as second magnetic field generating means are arranged on the outer periphery of the plasma generating space chamber portion 2. This plurality of permanent magnets 4 are made of same material as the permanent magnets 3 acting as the first magnetic field generating means and consist of a first permanent magnet group 4a on the upper wall 8a of the plasma generating space chamber portion 2, in which permanent magnets are disposed concentrically with a predetermined interval, a second permanent magnet group 4b on the side wall 8b of the plasma generating space chamber portion 2, in which permanent magnets are disposed with a predetermined interval along the side wall 8b, and further a third permanent magnet group 4c on the back side of the substrate 20 in the discharge chamber 100. Every adjacent two of these permanent magnets 4 have polarities opposite to each other. In this way a multi-pole cusped magnetic field is formed within the plasma generating space chamber portion 2 and at the same time a weak magnetic field region is formed in a wide region in the plasma generating space chamber portion 2. In the figure reference numeral 9 indicates magnetic lines of force representing the multi-pole cusped magnetic field formed by the plurality of permanent magnets. Speaking for reference, in the present embodiment, the magnetic field strength is 400 to 2400 G on the upper wall 8a and the side wall 8b, about 20 G at the central portion of the plasma generating space chamber portion 2, and lower than 10 G at the position of the substrate 20. Surrounded by this multi-pole cusped magnetic field, a weak magnetic field region weaker than 30 G is formed as a single space in the plasma generating space chamber portion 2 and occupies more than a half of the plasma generating space chamber portion 2 in volume.

The plasma generating apparatus in the present embodiment is constructed as described above and now an operation thereof will be explained.

When the discharge chamber 100 consisting of the electron heating space chamber portion 1 and the plasma generating space chamber portion 2 is in a gas atmosphere and when the waveguide portion 5 is fed with microwaves having a frequency of 2.45 GHz, the waveguide portion 5, which is a rectangular waveguide, transfers only the fundamental mode. The electric field direction in this microwave transfer mode is in accordance with the transversal width direction of the rectangular waveguide, as indicated in FIG. 4A.

At transmission of the microwave, owing to the fact that the electron heating space chamber portion 1 is formed on the downstream side from the dielectric body 6 in the waveguide portion 5, it is possible to introduce stably microwaves having a strong electric field into the electron heating space chamber portion 1. Further, in the present embodiment, since a rectangular waveguide 27 mm wide and 96 mm deep was used for the waveguide portion 5, it was possible to realize an average value of the microwave electric field strength of about 80 V/cm in the cross-section of the waveguide for inputted electric power of 400 W of the microwave. In addition, since microwaves are introduced into the electron heating space chamber portion 1 from the strong magnetic field side exceeding the electron cyclotron resonance magnetic field strength, even if a high density plasma having a density higher than the cut-off density as plasma is produced, it is possible to have microwave reach the electron cyclotron resonance layer 12 with a high efficiency.

When the electron heating space chamber portion 1 has such a small cross-section as described above, the permanent magnets 3 acting as the first static magnetic field generating means arranged around it can have a small size. The permanent magnets 3 generate a magnetic field having a strength exceeding that of the electron cyclotron resonance magnetic field at the leading-out portion 6a of the dielectric body 6 in the electron heating space chamber portion 1 and the magnetic field is attenuated therefrom so that the strength thereof decreases to 0 at a point in the neighborhood of the boundary between the electron heating space chamber portion 1 and the plasma generating space chamber portion 2. That is, distribution of the strength of the magnetic field generated by the permanent magnets 3 is steeply attenuated. For this reason, although the electron cyclotron resonance layer 12 is thin and electron heating capacity per microwave electric field strength is small, since the electric field strength itself is sufficiently high within the electron heating space chamber portion 1, it is possible to have electrons absorb microwaves almost completely to heat them. As the result, the electrons can be transformed into high energy electrons.

Electrons called "high energy electrons" here are those which are capable of ionizing gas and have an energy higher than about 10 eV. It is a matter of course that they are different from those having such an energy that cannot ionize gas.

Since a curve representing the distribution of the magnetic field strength generated by the permanent magnets 3 falls steeply in the electron heating space chamber portion 1 between the electron cyclotron resonance layer 12 and the position 14 where the magnetic field strength is 0 in the neighborhood of the boundary of the plasma generating space chamber portion 2, as indicated in FIG. 4C, and the length of these variations is smaller than the wavelength of the microwaves (about 12 cm in the present embodiment), it is possible to eliminate instability factors concerning propagation and absorption of the microwaves as far as possible and to utilize surely and stably microwaves having a high electric field for electron heating.

In general, electrons move approximately along magnetic lines of force in a strong magnetic field, but in a region where the magnetic field is weak they can easily traverse magnetic lines of force. For this reason, electrons in the electron heating space chamber portion 1 on the ending side thereof, i.e. electrons existing in the neighborhood of the position 14 where the magnetic field strength is 0 in the neighborhood of the boundary between the electron heating space chamber portion 1 and the plasma generating space chamber portion 2, can wander about in a shaded region in the figure. In this case, since electrons are heated to have a high energy, when they pass through an electron cyclotron resonance layer 12a or 12b, high energy electrons are diffused into the plasma generating space chamber portion 2 along the region of the cusped magnetic field and collide with neutral particles to ionize them, generating plasma, while wandering about in that region. Low energy electrons generated at this time enter the electron heating space chamber portion 1 while moving in the region of the multi-pole cusped magnetic field to be heated while passing through the electron cyclotron resonance layer 12a or 12b so that they become high energy electrons, which are in charge of ionization.

In this case, since the permanent magnets 3 form a cusped magnetic field, the magnetic field direction of which is reversed on the further downstream side from the portion where the magnetic field strength is 0 at the position 14 in the neighborhood of the boundary between the electron heating space chamber portion 1 and the plasma generating space chamber portion 2, as indicated in FIGS. 4A and 4C, current density of high energy electrons flying from the electron heating space chamber portion 1 to the plasma generating space chamber portion 2 varies according to a curve indicated in FIG. 4B, which has a peak on the center axis of the electron heating space chamber portion 1. For this reason, it is possible to promote plasma formation in a region distant from the electron heating space chamber portion 1, i.e in a weak magnetic field region within the plasma generating space chamber portion 2.

In general, under a low gas pressure ($10^{-5} \sim 10^{-3}$ Torr), since mean free paths required for electrons to ionize neutral particles amount several meters to several tens of meters, high energy electrons wander about at random in the weak magnetic field region while being reflected a number of times by the multi-pole cusped magnetic field surrounding the plasma generating space chamber portion 2, before they ionize neutral particles. For this reason plasma is generated with a uniform density in the weak magnetic field region. In addition, since the multi-pole cusped magnetic field is formed by arranging a plurality of permanent magnets acting as the second static magnetic field generating means on the periphery of the plasma generating space chamber portion 2 and by arranging the permanent magnets so that adjacent ones have polarities opposite to each other, not only diffused high energy electrons but also plasma generated by the high energy electrons can be confined in the plasma generating space chamber portion 2 with a high efficiency and therefore it is possible to generate surely a high density plasma. Plasma generated in such a weak magnetic field region is hardly influenced by the magnetic field and has good properties that distribution of different kinds of ions is uniform and that ion temperature is low.

On the other hand, since confinement of high energy electrons and plasma in the plasma generating space chamber portion 2 is effected with a higher efficiency with increasing magnetic field strength in the neighborhood of the permanent magnets, in some cases magnetic field strength is set at a value higher than the electron cyclotron resonance magnetic field strength in the proximity of the permanent magnets 4. However, as described above, in the present embodiment, since the discharge chamber 100 consists of the electron heating space chamber portion 1 formed on the downstream side from the dielectric body 6 in the waveguide portion 5 and the plasma generating space chamber portion 2 formed on the further downstream side, a strong magnetic field is formed on the upstream side of the electron heating space chamber portion 1 by the permanent magnets 3 arranged on the outer periphery of the electron heating space chamber portion 1, and a cusped magnetic field is formed by making the magnetic field steeply fall with decreasing distance to the downstream side, if a microwave is supplied by the waveguide portion 5, almost no electron heating takes place in the electron cyclotron resonance layer formed in the proximity of the permanent magnets 4 within the plasma generating space chamber portion 2, owing to the fact that the microwave is absorbed almost completely by the electron heating space chamber portion 1 and the cross-section of the plasma generating space chamber portion 2 is much larger so that electric field is very weak, even if the microwave leaks to the plasma generating space chamber portion 2.

By using the plasma thus generated, in which distribution of different kinds of ions is uniform and ion temperature is low, it is possible to subject the substrate 20 held on the supporting table 21 to uniform plasma processing over a wide area. Further, when a bias voltage is applied to the substrate 20 by means of a high frequency bias power supply 23 and a matching box 22, since the substrate 20 is irradiated with directive ions, it is possible to effect plasma processing such as a plasma etching having a good anisotropy, and a CVD film formation having a good step coverage.

Figure 5:
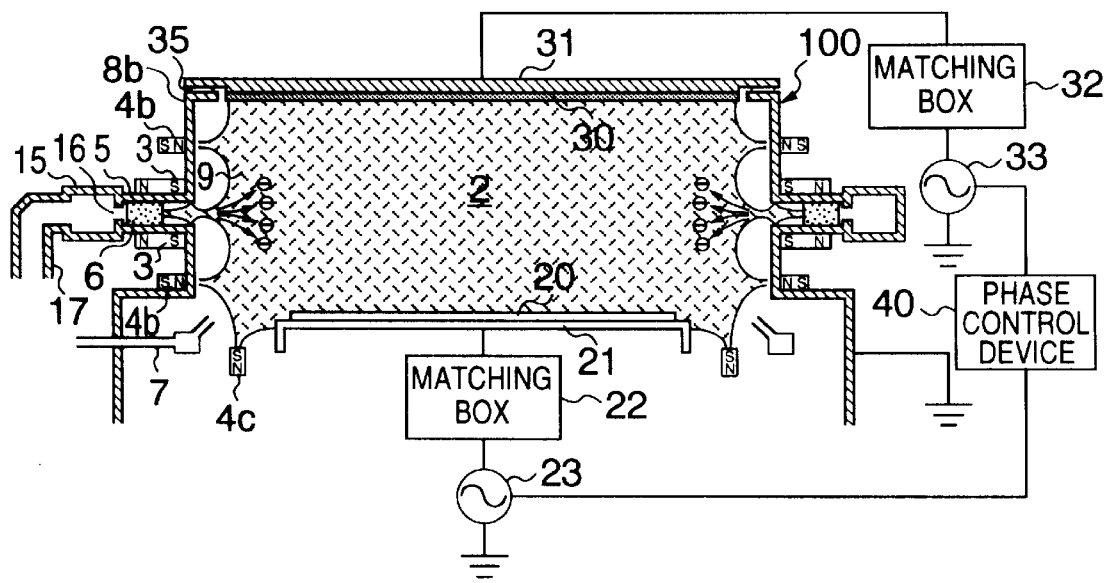
FIG. 5 is a cross-sectional view for explaining a second embodiment of the plasma processing apparatus according to the present invention.
Figure 6:
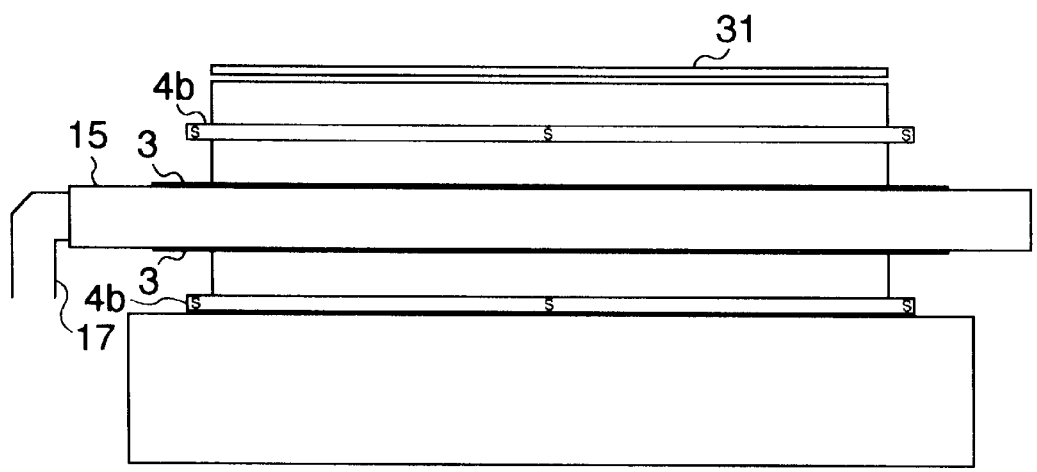
FIG. 6 is a front view of the plasma processing apparatus shown in FIG. 5.
Figure 7:
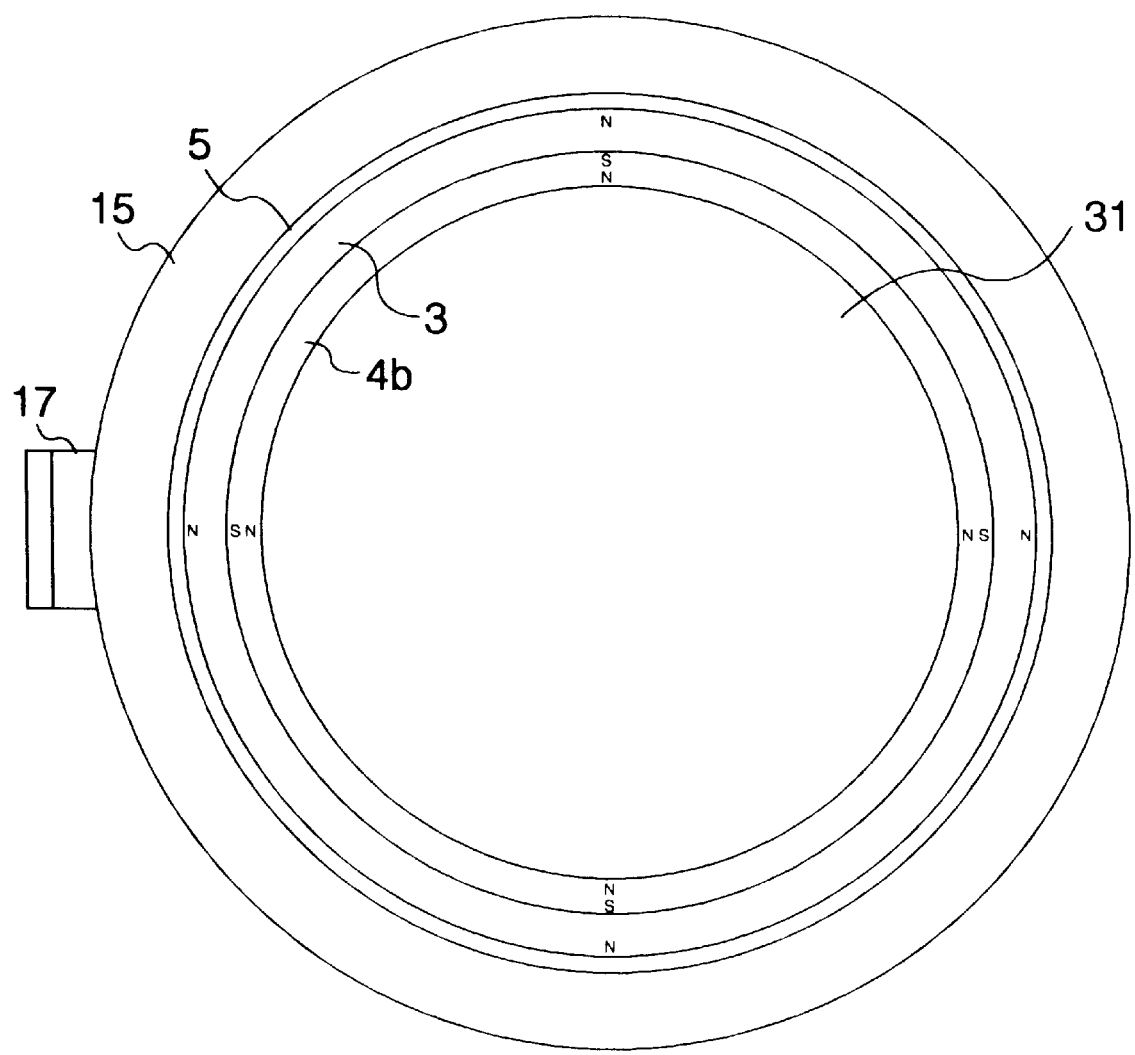
FIG. 7 is a plan view of the plasma processing apparatus shown in FIG. 5.

FIGS. 5 to 7 show a second embodiment of the present invention.

Compared with the first embodiment, the second embodiment differs remarkably therefrom in following two points, i.e. that the electron heating space chamber portion 1 is formed so as to surround the side surface over the whole periphery of the plasma generating space chamber portion 2 and that the counterplate 31 forms the upper end of the plasma generating space chamber portion 2, opposite to the substrate 20. These two points will mainly be explained below.

In the present embodiment, a waveguide portion 5 is coupled with the peripheral wall 8b of the plasma generating space chamber portion 2, surrounding all the 4 periphery thereof, and a ring-shaped dielectric body 6 is arranged in the waveguide portion 5 around the plasma generating space chamber portion 2. An electron heating space chamber portion 1 is formed in the waveguide portion 5 on the downstream side in the transmission direction of microwave, i.e. on the side closer to the center axis of the plasma generating space chamber portion 2 from the dielectric body 6. In this way the discharge chamber 100 is formed in one body with the plasma generating space chamber portion 2.

In order to introduce microwaves into the electron heating space chamber portion 1 so as to be uniform along all the periphery thereof, a cavity 15 is disposed on the upstream side of the waveguide portion 5 and coupled electrically with the waveguide portion 5 through a slit 16. In this way microwaves introduced from a rectangular waveguide 17 coupled with a part of the cavity 15 form stationary wave of a predetermined mode within the cavity 15 and are introduced into the waveguide portion 5 with a predetermined transmission mode through the slit 16. By optimizing the shape of the cavity 15 and the slit 16 it is possible to make microwave electric field uniform and to specify the microwave transmission mode within the waveguide portion 5.

Permanent magnets 3 acting as the first magnetic field generating means are arranged so that every two of them put the electron heating space chamber portion 1 therebetween in a pair. Each of the permanent magnets 3 has a ring-shape surrounding the plasma generating space chamber portion 2 and is magnetized in a same polarity in directions facing the center axis of the plasma generating space chamber portion 2. Material, of which the permanent magnets are made, is the same as used in the first embodiment. The longitudinal shape of the permanent magnets 3, the waveguide portion 5, the dielectric body 6 and the neighborhood of the electron heating space chamber portion 1 including a part of the plasma generating space chamber portion 2 is the same as that shown in FIG. 4A for the first embodiment and magnetic field formed by the permanent magnets 3 is also almost identical to that shown in FIGS. 4A and 4C. For this reason, since generation process of high energy electrons when microwave are introduced into the electron heating space chamber portion 1 and diffusion process of these high energy electrons into the plasma generating space chamber portion 2 are also identical to those explained in detail for the first embodiment, explanation thereof will be omitted here. On the other hand, owing to the fact that the electron heating space chamber is formed all around the side surface of the plasma generating space chamber portion 2, as described above, compared to the first embodiment, an effect is obtained that it is possible to supply more high energy electrons uniformly from the electron heating space chamber portion 1 to the plasma generating space chamber portion 2.

In addition to the fact that the shape of the electron heating space chamber portion 1 differs from that used in the first embodiment, as described above, it differs further therefrom in that a counterplate 31 made of a non-magnetic and electrically conductive material such as stainless steel, aluminium, etc. is mounted through an insulating spacer on the side wall 8b, in lieu of the circular upper wall 8a forming the upper end of the plasma generating space chamber portion 2 in the first embodiment, at the same position, i.e. opposite to the substrate 20, to form the upper end of the plasma generating space chamber portion 2. The size of the plasma generating space chamber portion 2 is identical to that used for the first embodiment. A matching box 32 and a high frequency bias power supply 33 forming the bias voltage applying means are connected to the counterplate 31. A target 30 is mounted on the side of the counterplate 31 facing the plasma generating space chamber portion 2. In this way the present embodiment constitutes a plasma processing apparatus suitable particularly for sputtering film formation. Further another matching box 22 and another high frequency bias power supply 23 are connected to the supporting table 21 so as to be able to apply an AC bias voltage to the substrate 20. A same frequency, in the present embodiment a commercial frequency of 13.56 MHz, is used for the two high frequency bias power supplies 33 and 23 and the apparatus is so constructed that it is possible to control phase difference between two AC bias voltages produced by the high frequency bias power supplies 33 and 23 by means of a phase control device 40.

A plurality of permanent magnets 4 acting as the second static magnetic field generating means are arranged on the outer periphery of the plasma generating space chamber portion 2. This plurality of permanent magnets 4 are made of the same material as the permanent magnets 3 acting as the first static magnetic field generating means and constitute a second permanent magnet group 4b disposed on the side wall 8b of the plasma generating space chamber portion 2 with a predetermined interval and along the side wall 8b and a third permanent magnet group 4c disposed on the back side of the substrate 20 within the discharge chamber 100, as indicated in FIGS. 5 and 6. Adjacent ones of the permanent magnets 4 have polarities opposite to each other. In this way a multi-pole cusped magnetic field is formed within the plasma generating space chamber portion 2 and at the same time a weak magnetic field region is formed in a wide region in the plasma generating space chamber portion 2. In the figure reference numeral 9 indicates magnetic lines of force representing the multi-pole cusped magnetic field formed by the plurality of permanent magnets. Speaking for reference, in the present embodiment, the magnetic field strength is 400 to 2400 G on the side wall 8b, about 15 G at the central portion of the plasma generating space chamber portion 2, and lower than 10 G at the position of the substrate 20 and the target 30. Surrounded by this multi-pole cusped magnetic field, a weak magnetic field region weaker than 30 G is formed as a single space in the plasma generating space chamber portion 2 and occupies more than a half of the plasma generating space chamber portion 2 in volume.

An operation of the plasma processing apparatus in the present embodiment will now be explained, taking a case where an $SiO_2$ film is formed on the substrate 20 by sputtering film formation as an example. In this case the target 30 is made of $SiO_2$. Mixed gas of argon as sputter gas and oxygen supplementing insufficiency in oxygen in the film formed on the surface of the substrate 20 is introduced into the discharge chamber 100 through gas introducing means 7 so as to obtain a low gas pressure atmosphere, in which the gas pressure in the discharge chamber is in the first half of the order of $10^{-4}$ Torr. When the electron heating space chamber portion 1 is fed with microwaves having a frequency of 2.45 GHz in this state, high energy electrons are produced in the electron heating space chamber portion 1 by the operation explained in detail in the first embodiment and supplied to the plasma generating space chamber portion 2. Then these high energy electrons produce a high density plasma over a wide region in the plasma generating space chamber portion 2 by the operation, which is explained similarly in detail in the first embodiment.

When an AC bias voltage is applied to the counterplate 31 by means of the matching box 32 and the high frequency bias power supply 33 in this state, where a uniform high density plasma is generated over a wide region, as described above, the surface of the target 30 is biased negatively with respect to plasma potential. Therefore, ions in the plasma are accelerated in a sheath formed on the surface of the target to sputter the whole surface of the target and sputtered particles produced in this way fly to the substrate 20 held on the supporting table 21 at a position opposite to the target to form an $SiO_2$ film on the surface of the substrate 20.

At this time, since the whole surface of the target 30 is sputtered by ions in the uniform plasma in a wide region, utilization efficiency of the target 30 is high, which can reduce frequency of exchange of the target. Further, since the gas pressure in the discharge chamber is a low gas pressure, which is in the first half of the order of $10^{-4}$ Torr, sputtered particles collide only rarely with neutral particles on the way to change their trajectories, that is, sputtered particles fly well straight. Therefore it is possible to subject the matter to be processed to sputtering film formation having a good step coverage.

By applying further an AC bias voltage to the substrate 20 on the supporting table 21 by means of the matching box 22 and the high frequency bias power supply 23 during the sputtering film formation, a so-called bias sputtering film formation can be effected. By the bias sputtering film formation, while forming a sputter film on the substrate, this film is exposed at the same time to etch-back by ion collision. This is a film forming method, by which it is possible to form a film having a better step coverage. At this bias sputter, by controlling positively phase difference between the AC bias voltages applied to the target 30 and the substrate 20 by the high frequency bias power supplies 33 and 23, respectively, it is possible to control absolute values and mutual ratio of film formation rate and etch-back rate and therefore an effect can be obtained that the film formation process can be easily optimized.

Figure 8:
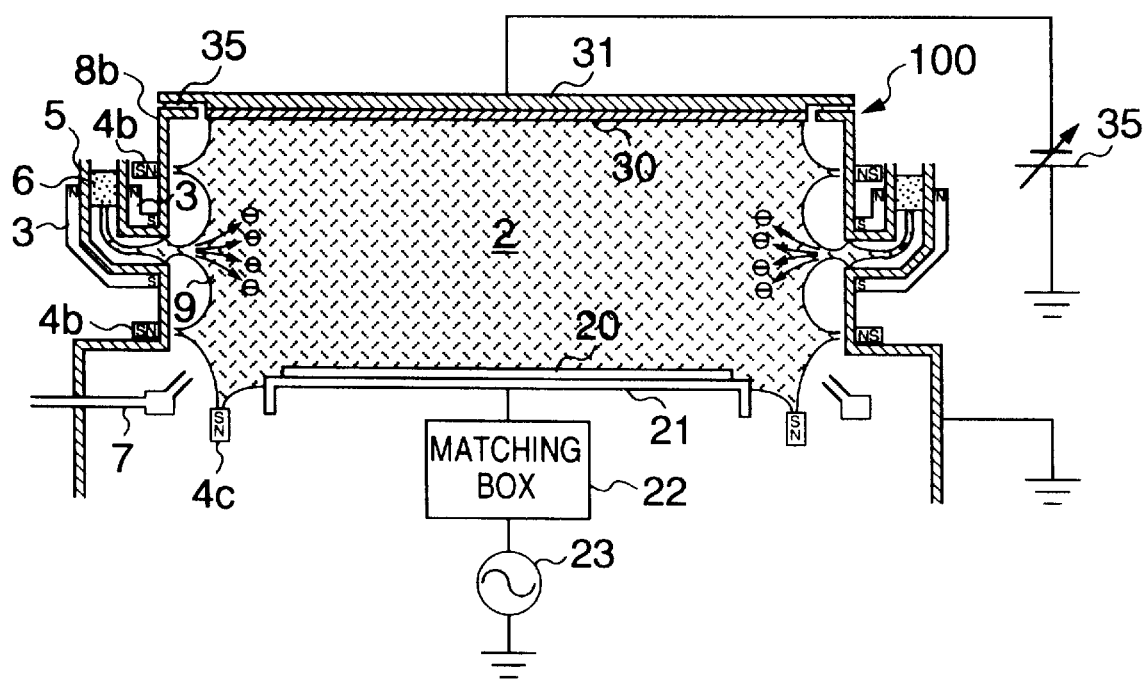
FIG. 8 is a cross-sectional view for explaining a third embodiment of the plasma processing apparatus according to the present invention.
Figure 9A:
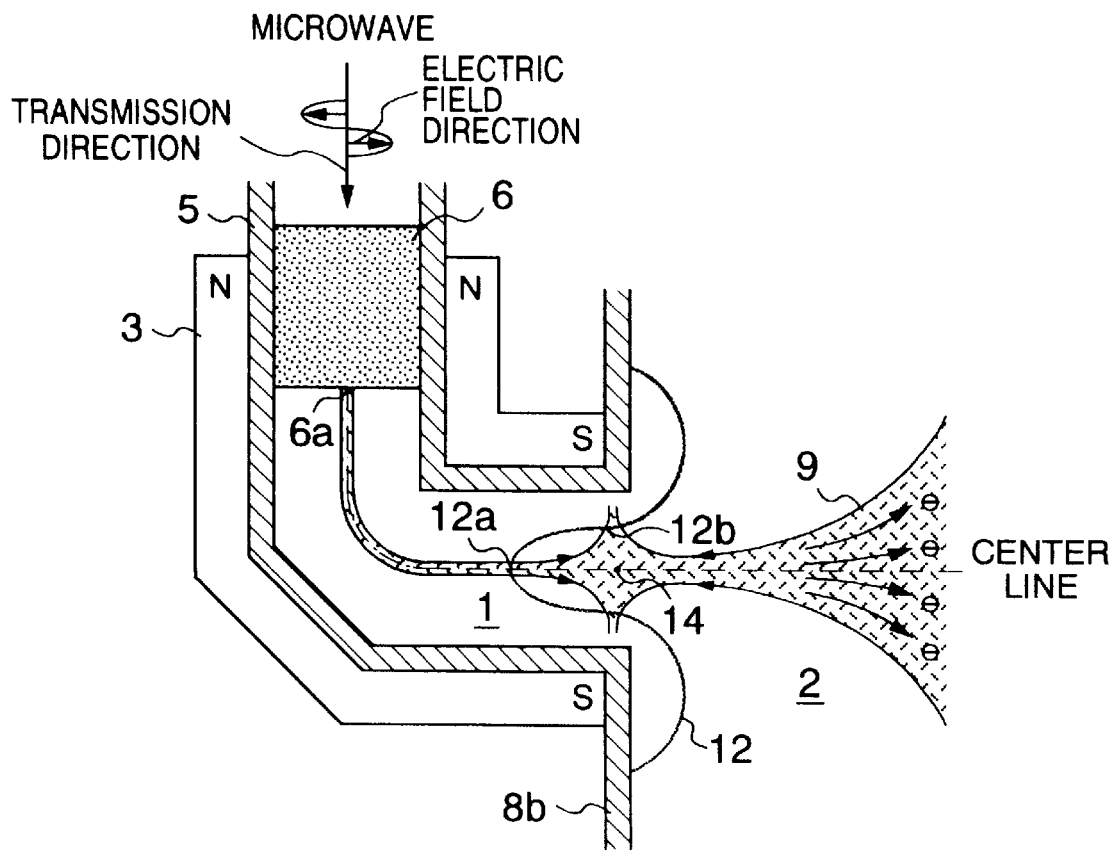
FIG. 9A is an enlarged diagram showing a principal part of the third embodiment.
Figure 9B:
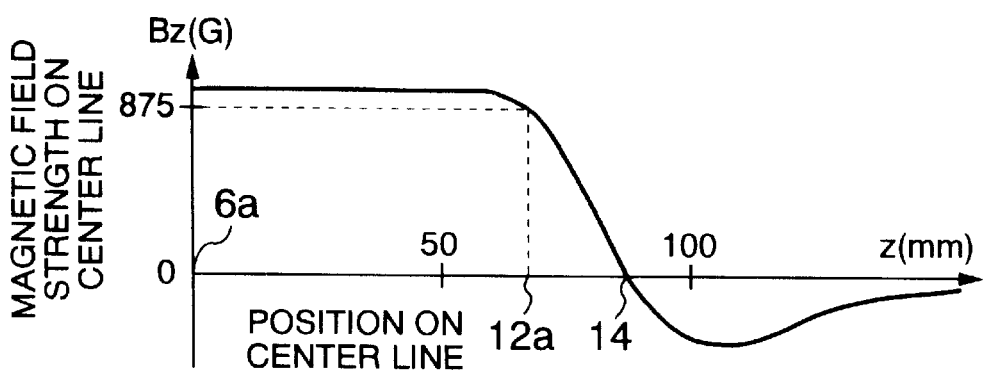
FIG. 9B is a graph showing a magnetic field strength distribution at different positions in the electron space chamber portion and the plasma generating space chamber portion.

FIGS. 8, 9A and 9B show a third embodiment of the present invention.

The plasma processing apparatus in the present embodiment differs remarkably from that described in the second embodiment in that the waveguide portion 5 is bent on the downstream side from the dielectric body 6 in the waveguide portion 5 and consequently the electron heating space chamber portion 1 has a bent shape so that the microwave leading-out portion 6a of the dielectric body 6 cannot be seen directly from the plasma generating space chamber portion 2. Accompanied thereby, the permanent magnets 3 acting as the first static magnetic field means arranged closely to the outer side of the waveguide portion 5 has a shape extending along the center line of the waveguide portion 5 from the dielectric body 6 to the downstream end thereof, as shown in the figure so as to form magnetic field along the transmission direction of microwave, as shown in FIGS. 9A and 9B. At this time, in the electron heating space chamber portion 1, the magnetic field has a strength exceeding the electron cyclotron resonance magnetic field strength (875 G) at the microwave leading-out portion 6a. The apparatus is so constructed that the magnetic field strength is gradually attenuated therefrom towards the downstream side to the neighborhood of the electron cyclotron resonance layer 12, that from the neighborhood of the electron cyclotron resonance layer 12 it is steeply attenuated towards the further downstream side and it becomes 0 at the position 14 in the neighborhood of the boundary between the ending side of the electron heating space chamber portion 1 and the plasma generating space chamber portion 2, and that a cusped magnetic field is formed, in which the direction of the magnetic field is reversed on the further downstream side to the plasma generating space chamber portion 2.

The distance from the electron cyclotron resonance layer 12 to the position 14 where the magnetic field strength is 0 in the neighborhood of the boundary between the ending side of the electron heating space chamber portion 1 and the plasma generating space chamber portion 2 in the present embodiment is about 2 cm. Since this is smaller than the microwave wavelength (about 12 cm in the present embodiment), it is possible to eliminate instability factors concerning propagation and absorption of microwave as far as possible and to utilize high electric field microwave surely and stably for electron heating.

The construction of the apparatus is identical to that described in the second embodiment apart from the construction of the electron heating space chamber portion 1 and that means for applying the bias voltage to the counterplate 31 is a DC bias power supply 35 and the plasma processing apparatus in the present embodiment is suitable particularly for sputtering film formation for conductive thin films, as explained below.

That is, when sputtering film formation is effected by using the plasma processing apparatus in the present embodiment, since it is so constructed that the microwave leading-out portion 6a of the dielectric body 6 cannot be seen directly from the plasma generating space chamber portion 2, sputtered particles flying from the target 30 don't stick to the microwave leading-out portion 6a. Consequently, even if the material, of which the target 30 is made, is conductive such as e.g. aluminium, etc., no conductive film is formed on the surface of the microwave leading-out portion 6a and therefore it is possible to effect stably plasma processing of the substrate 20 in a long duration while introducing microwaves into the discharge chamber 100.

Figure 10A:
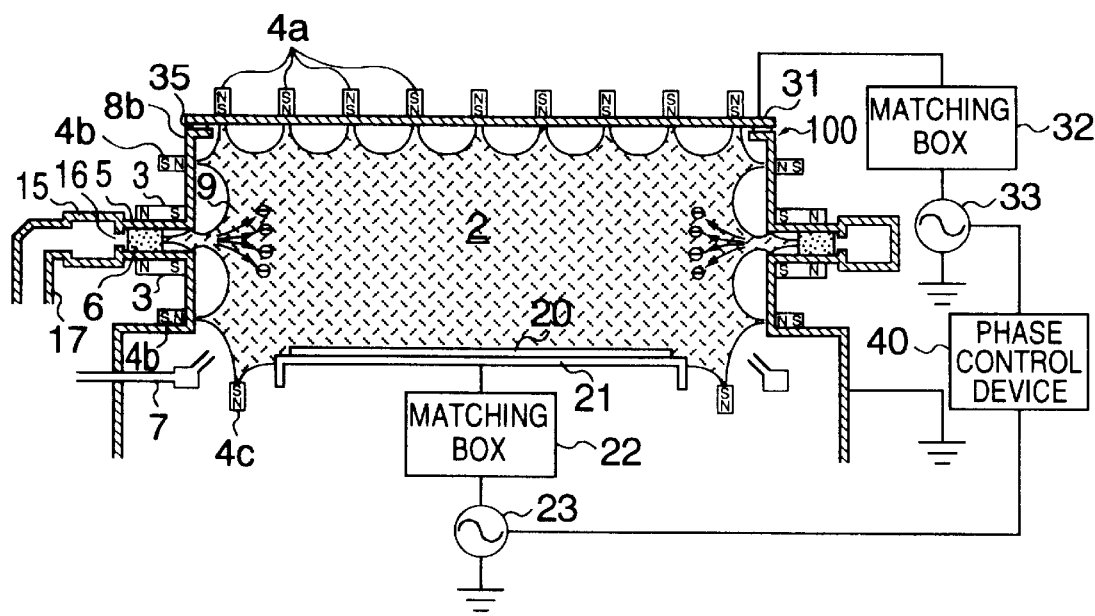
FIG. 10A is a cross-sectional view for explaining a fourth embodiment at plasma processing of the plasma processing apparatus according to the present invention.
Figure 10B:
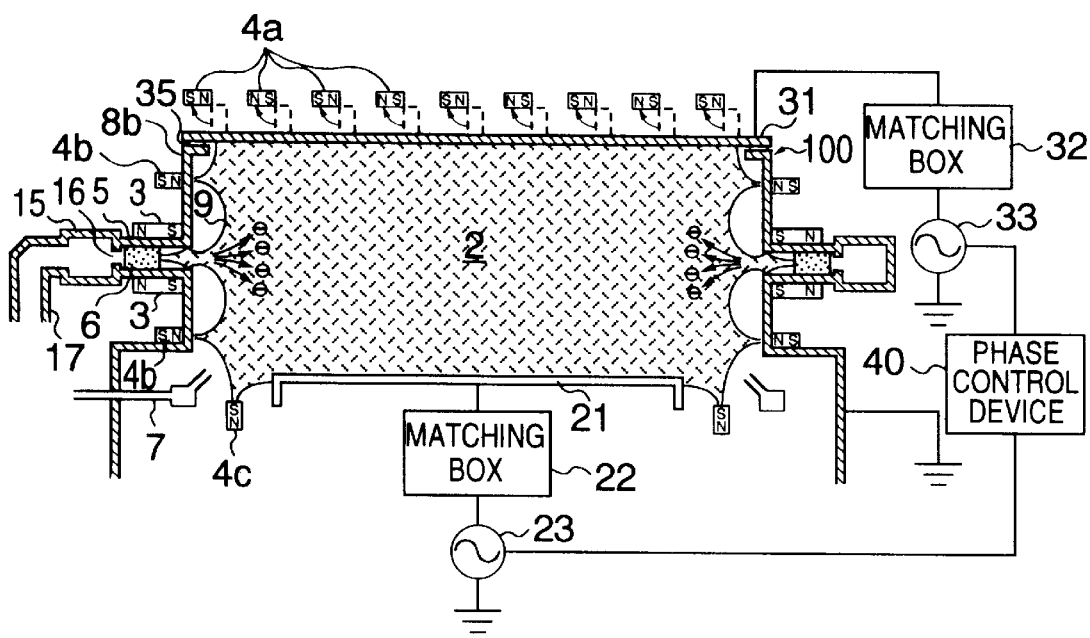
FIG. 10B is a cross-sectional view for explaining the same apparatus as FIG. 10A at cleaning.
Figure 11:
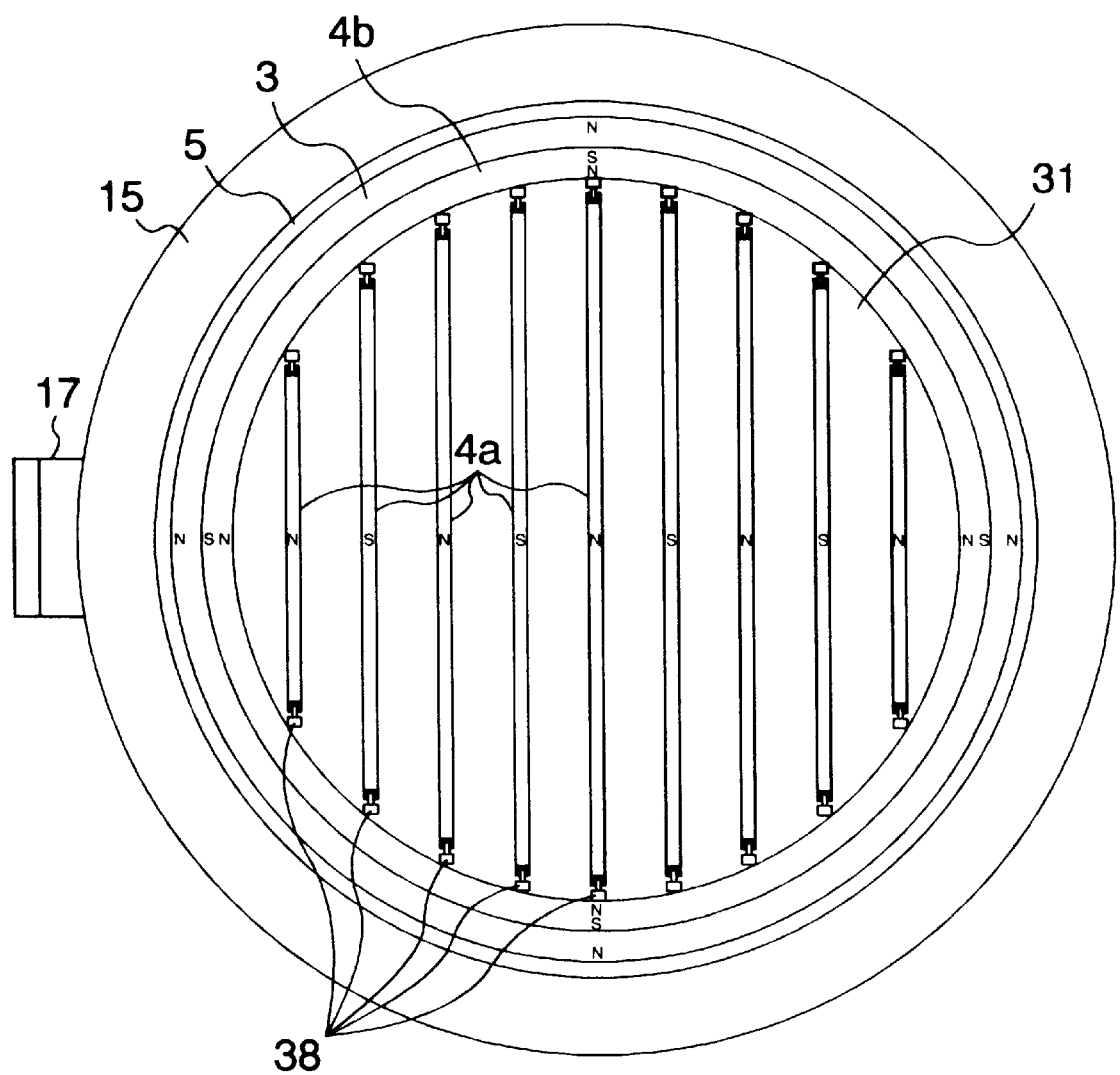
FIG. 11 is a plan view of the plasma processing apparatus shown in FIG. 10A.

FIGS. 10A, 10B and 11 show a fourth embodiment of the present invention.

In the plasma processing apparatus in the present embodiment, the permanent magnets 4a acting as the second static magnetic field generating means are mounted on the counterplate 31 by means of jigs 38 on the side opposite to the side of the counterplate 31 facing the plasma generating space chamber portion 2, as indicated in FIG. 11, so that the permanent magnets 4a are movable with respect to the counterplate 31. Since the other construction of the apparatus is identical to that described in the second embodiment apart from the fact that there is no target 30, explanation thereof will be omitted.

Hereinbelow an operation of the present embodiment will be explained, taking a case where an $SiO_2$ film is formed on the substrate 20 by bias plasma CVD film formation as an example.

At first, the permanent magnets 4a are brought close to the counterplate 31 and mixed gas of monosilane acting as film forming gas, oxygen for supplementing insufficiency in oxygen in the film formed on the surface of the substrate 20, and argon for etching-back the film formed on the surface of the substrate 20 is introduced into the discharge chamber 100 by means of the gas introducing means 7 so as to realize a low gas pressure atmosphere, in which the gas pressure in the discharge chamber is $10^{-4}$~$10^{-3}$ Torr. In this state, when the electron heating space chamber portion 1 is fed with microwave having a frequency of 2.45 GHz, high energy electrons are produced in the electron heating space chamber portion 1 by the action explained in detail in the first embodiment, which gives rise to a uniform high density plasma in a wide region within the plasma generating space chamber portion 2. At this time, accompanied thereby, radicals are also produced.

Ions and radicals in the high density plasma produced uniformly in the wide region as described above reach the surface of the substrate 20 held on the supporting table 21 to form the $SiO_2$ film. At the same time, since the $SiO_2$ film, which is being formed on the surface of the substrate 20, is etched-back to be flattened by applying the AC bias voltage to the substrate on the supporting table by means of the matching box 22 and the high frequency power supply 23, an $SiO_2$ film having a good coverage is formed finally on the surface of the substrate 20. During this film formation processing, since the permanent magnets 4a form a multipole cusped magnetic field on the surface of the counterplate 31 at the upper end of the plasma generating space chamber portion 2 to confine the plasma, a major part of ions in the plasma pour in the substrate 20 side supported at a position opposite to the counterplate 31 and therefore it is possible to increase utilization efficiency of ions.

On the other hand, when the film formation processing is effected continuously, it is inevitable that films are formed on the inner wall of the discharge chamber 100. When an amount of films exceeding a certain limit is formed, films are peeled off from the wall surface, forming particles, which gives rise to contamination of the surface of the substrate 20. Since particularly particles produced at a part of the wall surface, which is vertically above the substrate 20, to which the counterplate 31 corresponds in the present embodiment, fall to the substrate 20 by gravitation, influences thereof are important. For this reason it is necessary to effect periodically processing for eliminating films stuck to the wall surface of the discharge chamber (called plasma cleaning processing). Plasma leaning processing in the plasma processing apparatus in the present embodiment will be explained below.

At first, as indicated in FIG. 10B, the permanent magnets 4a are pulled apart from the counterplate 31 to realize a state where there is almost no magnetic field on the surface of the counterplate. Then etching gas such as carbon tetrafluoride, etc. is introduced into the discharge chamber 100 by the gas introducing means 7 and further microwaves are introduced from the waveguide portion 5 to generate plasma. In this state, when an AC bias voltage is applied to the counterplate 31 by means of the matching box 32 and the high frequency bias power supply 33, the surface of the counterplate 31 is biased negatively with respect to the plasma potential. Therefore ions in the plasma are accelerated in a sheath formed on the surface of the counterplate 31 to collide with the counterplate 31. In this way it is possible to eliminate films stuck to the surface of the counterplate 31 with a high speed. At this time, since the state where there is almost no magnetic field on the surface of the counterplate 32 is realized, as described above, the whole surface of the counterplate is uniformly cleaned.

As described above, in the present embodiment, since it is possible to particularly clean well the counterplate 31 having remarkable influences on particle contamination of the substrate 20 on the part of the wall surface, which is vertically above the substrate 20, a significant effect of cleaning processing can be obtained. Similarly cleaning of the supporting table 21 can be effected by applying the AC bias voltage to the supporting table 21 by means of the matching box 22 and the high frequency bias power supply 23. Further, if phase difference between the two AC bias voltages applied to the counterplate 31 and the supporting table 21 by the high frequency bias power supplies 33 and 23, respectively is controlled positively, it is possible to optimize plasma cleaning for the whole apparatus.

We claim:

1. A plasma processing apparatus comprising:
   at least one waveguide portion for introducing microwaves;
   a plasma generating space chamber portion coupled with said waveguide portion;
   first static magnetic field generating means consisting of permanent magnets surrounding said waveguide portion, which have an electron cyclotron resonance magnetic field strength at least at a part of said waveguide portion and said plasma generating space chamber portion and forming a cusped magnetic field, a direction of which is reversed along a transmission direction of microwaves in said waveguide portion;
   second static magnetic field generating means consisting of permanent magnets arranged around said plasma generating space chamber portion, every adjacent two of which have polarities opposite to each other;
   means for holding matter to be processed facing said plasma generating space chamber portion;
   a counterplate facing said plasma generating space chamber portion, opposite to said matter to be processed; and
   means for applying a bias voltage to said counterplate.

2. A plasma processing apparatus comprising:
   at least one waveguide portion for introducing microwaves;
   a plasma generating space chamber portion coupled with said waveguide portion;
   first static magnetic field generating means consisting of permanent magnets surrounding said waveguide portion, which have an electron cyclotron resonance magnetic field strength at least at a part of said waveguide portion and said plasma generating space chamber portion and forming a cussed magnetic field, a direction of which is reversed along a transmission direction of microwaves in said waveguide portion;
   second static magnetic field generating means consisting of permanent magnets arranged around said plasma generating space chamber portion, every adjacent two of which have polarities opposite to each other;
   means for holding matter to be processed facing said plasma generating space chamber portion;
   means for applying an AC bias voltage to said matter to be processed;
   a counterplate facing said plasma generating space chamber portion, opposite to said matter to be processed;
   means for applying an AC bias voltage to said counterplate; and
   means for controlling a phase of said AC bias voltage applied to said matter to be processed and a phase of said AC bias voltage applied to said counterplate.

3. A plasma processing apparatus comprising:
   at least one waveguide portion for introducing microwaves;
   an electron heating space chamber portion formed on a downstream side with respect to a dielectric body disposed within said waveguide portion;
   a plasma generating space chamber portion coupled with said electron heating space chamber portion;
   first static magnetic field generating means consisting of permanent magnets surrounding said electron heating space chamber portion, which produce a strong magnetic field exceeding an electron cyclotron resonance magnetic field strength at a microwave leading-out portion of said electron heating space chamber portion and which form a cusped magnetic field, a direction of which is reversed along a transmission direction of microwaves in said waveguide portion;
   second static magnetic field generating means consisting of permanent magnets arranged around said plasma generating space chamber portion, every adjacent two of which have polarities opposite to each other;
   means for holding matter to be processed facing said plasma generating space chamber portion;
   a counterplate facing said plasma generating space chamber portion, opposite to said matter to be processed; and
   means for applying a bias voltage to said counterplate.

4. A plasma processing apparatus comprising:
   at least one waveguide portion for introducing microwaves;
   an electron heating space chamber portion formed on a downstream side with respect to a dielectric body disposed within said waveguide portion;
   a plasma generating space chamber portion coupled with said electron heating space chamber portion;
   first static magnetic field generating means consisting of permanent magnets surrounding said electron heating space chamber portion, which produce a strong magnetic field exceeding an electron cyclotron resonance magnetic field strength at a microwave leading-out portion of said electron heating space chamber portion and which form a cusped magnetic field, a direction of which is reversed along a transmission direction of microwaves in said waveguide portion;
   second static magnetic field generating means consisting of permanent magnets arranged around said plasma generating space chamber portion, every adjacent two of which have polarities opposite to each other;
   means for holding matter to be processed facing said plasma generating space chamber portion;
   means for applying an AC bias voltage to said matter to be processed;
   a counterplate facing said plasma generating space chamber portion, opposite to said matter to be processed;
   means for applying an AC bias voltage to said counterplate; and
   means for controlling a phase of said AC bias voltage applied to said matter to be processed and a phase of said AC bias voltage applied to said counterplate.

5. A plasma processing apparatus according to claim 1, wherein a target is held on a side of said counterplate facing said plasma generating space chamber portion.

6. A plasma processing apparatus according to claim 1, wherein said permanent magnets acting as said second static magnetic field generating means are arranged on a side opposite to a side of said counterplate facing said plasma generating space chamber portion and said permanent magnets are movable with respect to said counterplate.

7. A plasma processing apparatus according to claim 1, wherein said waveguide portion is bent.

8. A plasma processing apparatus according to claim 1, wherein said waveguide portion is formed on a side surface of said plasma generating space chamber portion.

9. A plasma processing apparatus according to claim 8, wherein said waveguide portion is formed, surrounding the whole side surface of said plasma generating space chamber portion.

10. A plasma processing method, whereby a matter to be processed is held in a plasma processing apparatus according to claim 1 and plasma generated in a plasma generating space chamber portion is made to react with said matter to be processed.

11. A plasma processing apparatus comprising:
at least one waveguide portion for introducing microwaves;
a plasma generating space chamber portion coupled with said waveguide portion;
a first plurality of permanent magnets surrounding said waveguide portion, which have an electron cyclotron resonance magnetic field strength at least at a part of said waveguide portion and said plasma generating space chamber portion and forming a cusped magnetic field, a direction of which is reversed along a transmission direction of microwaves in said waveguide portion;
a second plurality of permanent magnets arranged around said plasma generating space chamber portion, adjacent ones of which have polarities opposite to each other;
a support onto which matter to be processed is placed so as to be facing said plasma generating space chamber portion;
a counterplate facing said plasma generating space chamber portion, opposite to said matter to be processed; and
means for applying a bias voltage to said counterplate.

12. A plasma processing apparatus comprising:
at least one waveguide portion for introducing microwaves;
a plasma generating space chamber portion coupled with said waveguide portion;
a first plurality of permanent magnets surrounding said waveguide portion, which have an electron cyclotron resonance magnetic field strength at least at a part of said waveguide portion and said plasma generating space chamber portion and forming a cusped magnetic field, a direction of which is reversed along a transmission direction of microwaves in said waveguide portion;
a second plurality of permanent magnets arranged around said plasma generating space chamber portion, adjacent ones of which have polarities opposite to each other;
a support onto which matter to be processed is placed so as to be facing said plasma generating space chamber portion;
means for applying an AC bias voltage to said matter to be processed;
a counterplate facing said plasma generating space chamber portion, opposite to said matter to be processed;
means for applying an AC bias voltage to said counterplate; and means for controlling a phase of said AC bias voltage applied to said matter to be processed and a phase of said AC bias voltage applied to said counterplate.

13. A plasma processing apparatus comprising:
at least one waveguide portion for introducing microwaves;
an electron heating space chamber portion formed on a downstream side with respect to a dielectric body disposed within said waveguide portion;
a plasma generating space chamber portion coupled with said electron heating space chamber portion;
a first plurality of permanent magnets surrounding said electron heating space chamber portion, which produce a strong magnetic field exceeding an electron cyclotron resonance magnetic field strength at a microwave leading-out portion of said electron heating space chamber portion and which form a cusped magnetic field, a direction of which is reversed along a transmission direction of microwaves in said waveguide portion;
a second plurality of permanent magnets arranged around said plasma generating space chamber portion, adjacent ones of which have polarities opposite to each other;
a support onto which matter to be processed is placed so as to be facing said plasma generating space chamber portion;
a counterplate facing said plasma generating space chamber portion, opposite to said matter to be processed; and
means for applying a bias voltage to said counterplate.

14. A plasma processing apparatus comprising:
at least one waveguide portion for introducing microwaves;
an electron heating space chamber portion formed on a downstream side with respect to a dielectric body disposed within said waveguide portion;
a plasma generating space chamber portion coupled with said electron heating space chamber portion;
a first plurality of permanent magnets surrounding said electron heating space chamber portion, which produce a strong magnetic field exceeding an electron cyclotron resonance magnetic field strength at a microwave leading-out portion of said electron heating space chamber portion and which form a cusped magnetic field, a direction of which is reversed along a transmission direction of microwaves in said waveguide portion;
a second plurality of permanent magnets arranged around said plasma generating space chamber portion, adjacent ones of which have polarities opposite to each other;
means for holding matter to be processed facing said plasma generating space chamber portion;
means for applying an AC bias voltage to said matter to be processed;
a counterplate facing said plasma generating space chamber portion, opposite to said matter to be processed;
means for applying an AC bias voltage to said counterplate; and
means for controlling a phase of said AC bias voltage applied to said matter to be processed and a phase of said AC bias voltage applied to said counterplate.

15. A plasma processing apparatus according to claim 11, wherein a target is held on a side of said counterplate facing said plasma generating space chamber portion.

16. A plasma processing apparatus according to claim 11, wherein said second plurality of permanent magnets are arranged on a side opposite to a side of said counterplate facing said plasma generating space chamber portion and said permanent magnets are movable with respect to said counterplate.

17. A plasma processing apparatus according to claim 11, wherein said waveguide portion is bent.

18. A plasma processing apparatus according to claim 11, wherein said waveguide portion is formed on a side surface of said plasma generating space chamber portion.

19. A plasma processing apparatus according to claim 18, wherein said waveguide portion is formed, surrounding the whole side surface of said plasma generating space chamber portion.

20. A plasma processing method, whereby matter to be processed is held in a plasma processing apparatus according to claim 11 and plasma generated in a plasma generating space chamber portion is made to react with said matter to be processed.

21. A plasma processing apparatus comprising:
at least one waveguide portion for introducing microwaves;
a plasma generating space chamber portion coupled with said waveguide portion;
first static magnetic field generating means having permanent magnets surrounding said waveguide portion, and having an electron cyclotron resonance magnetic field strength at least at a part of said waveguide portion and said plasma generating space chamber portion and forming a cusped magnetic field, a direction of which is reversed along a transmission direction of microwaves in said waveguide portion;
second static magnetic field generating means having permanent magnets arranged around said plasma generating space chamber portion, adjacent ones of which have polarities opposite to each other;
means for holding matter to be processed facing said plasma generating space chamber portion;
a counterplate facing said plasma generating space chamber portion, opposite to said matter to be processed; and
means for applying a bias voltage to said counterplate.

22. A plasma processing apparatus comprising:
at least one waveguide portion for introducing microwaves;
a plasma generating space chamber portion coupled with said waveguide portion;
first static magnetic field generating means having permanent magnets surrounding said waveguide portion, and having an electron cyclotron resonance magnetic field strength at least at a part of said waveguide portion and said plasma generating space chamber portion and forming a cusped magnetic field, a direction of which is reversed along a transmission direction of microwaves in said waveguide portion;
second static magnetic field generating means having permanent magnets arranged around said plasma generating space chamber portion, adjacent ones of which have polarities opposite to each other;
means for holding matter to be processed facing said plasma generating space chamber portion;
means for applying an AC bias voltage to said matter to be processed;
a counterplate facing said plasma generating space chamber portion, opposite to said matter to be processed;
means for applying an AC bias voltage to said counterplate; and
means for controlling a phase of said AC bias voltage applied to said matter to be processed and a phase of said AC bias voltage applied to said counterplate.

23. A plasma processing apparatus comprising:
at least one waveguide portion for introducing microwaves;
an electron heating space chamber portion formed on a downstream side with respect to a dielectric body disposed within said waveguide portion;
a plasma generating space chamber portion coupled with said electron heating space chamber portion;
first static magnetic field generating means having permanent magnets surrounding said electron heating space chamber portion, for producing a strong magnetic field exceeding an electron cyclotron resonance magnetic field strength at a microwave leading-out portion of said electron heating space chamber portion and which form a cusped magnetic field, a direction of which is reversed along a transmission direction of microwaves in said waveguide portion;
second static magnetic field generating means having permanent magnets arranged around said plasma generating space chamber portion, adjacent ones of which have polarities opposite to each other;
means for holding matter to be processed facing said plasma generating space chamber portion;
a counterplate facing said plasma generating space chamber portion, opposite to said matter to be processed; and
means for applying a bias voltage to said counterplate.

24. A plasma processing apparatus comprising:
at least one waveguide portion for introducing microwaves;
an electron heating space chamber portion formed on a downstream side with respect to a dielectric body disposed within said waveguide portion;
a plasma generating space chamber portion coupled with said electron heating space chamber portion;
first static magnetic field generating means having permanent magnets surrounding said electron heating space chamber portion, for producing a strong magnetic field exceeding an electron cyclotron resonance magnetic field strength at a microwave leading-out portion of said electron heating space chamber portion and which form a cusped magnetic field, a direction of which is reversed along a transmission direction of microwaves in said waveguide portion;
second static magnetic field generating means having permanent magnets arranged around said plasma generating space chamber portion, adjacent ones of which have polarities opposite to each other;
means for holding matter to be processed facing said plasma generating space chamber portion;
means for applying an AC bias voltage to said matter to be processed;
a counterplate facing said plasma generating space chamber portion, opposite to said matter to be processed;
means for applying an AC bias voltage to said counterplate; and
means for controlling a phase of said AC bias voltage applied to said matter to be processed and a phase of said AC bias voltage applied to said counterplate.

25. A plasma processing apparatus according to claim 21, wherein a target is held on a side of said counterplate facing said plasma generating space chamber portion.

26. A plasma processing apparatus according to claim 21, wherein said permanent magnets acting as said second static magnetic field generating means are arranged on a side opposite to a side of said counterplate facing said plasma generating space chamber portion and said permanent magnets are movable with respect to said counterplate.

27. A plasma processing apparatus according to claim 21, wherein said waveguide portion is bent.

28. A plasma processing apparatus according to claim 21, wherein said waveguide portion is formed on a side surface of said plasma generating space chamber portion.

29. A plasma processing apparatus according to claim 28, wherein said waveguide portion is formed, surrounding the whole side surface of said plasma generating space chamber portion.

30. A plasma processing method, whereby matter to be processed is held in a plasma processing apparatus according to claim 21 and plasma generated in a plasma generating space chamber portion is made to react with said matter to be processed.

* * * * *